United States Patent [19]
Bae et al.

[11] Patent Number: 5,202,274
[45] Date of Patent: Apr. 13, 1993

[54] METHOD OF FABRICATING THIN FILM TRANSISTOR

[75] Inventors: Byungseong Bae, Seoul; Insik Jang, Kyunggi; Namdeog Kim, Seoul, all of Rep. of Korea

[73] Assignee: Samsung Electronics Co., Ltd., Kwonseon, Rep. of Korea

[21] Appl. No.: 812,112

[22] Filed: Dec. 23, 1991

Related U.S. Application Data

[63] Continuation of Ser. No. 811,799, Dec. 20, 1991, abandoned.

[30] Foreign Application Priority Data

Jun. 14, 1991 [KR] Rep. of Korea ............. 91-9886

[51] Int. Cl.⁵ ............... H01L 21/335; H01L 21/311
[52] U.S. Cl. ............................ 437/40; 437/194; 437/197; 437/236
[58] Field of Search ............ 437/40, 194, 197, 235, 437/236, 983, 170, 237; 357/23.7; 156/665

[56] References Cited

U.S. PATENT DOCUMENTS 4,001,871  1/1977  Tsunemitsu .............. 437/236
4,421,785 12/1983  Kroger ..................... 437/190

FOREIGN PATENT DOCUMENTS 53-114365 10/1978  Japan ..................... 437/236
57-162350 10/1982  Japan ..................... 437/236
2-85826   3/1990  Japan .

OTHER PUBLICATIONS

"Silicon Processing for the VLSI Era"; vol. 1: Process Technology; Stanley Wolf Ph.D.; Richard N. Tauber Ph.D.; Lattice Press, Calif.

*Primary Examiner*—T. N. Quach
*Attorney, Agent, or Firm*—Christie, Parker & Hale

[57] ABSTRACT

A method of fabricating a thin film transistor wherein electrode wirings and an insulating layer are fabricated by depositing on a substrate an aluminum alloy layer to become electrode wiring. An $Al_2O_3$ layer having a given thickness is then formed by a first anodization of the aluminum alloy layer. Photoresist patterns are then formed that correspond to the electrode wirings on the $Al_2O_3$ layer so as to pattern the aluminum alloy layer. The $Al_2O_3$ and aluminum alloy layer is then dry-etched to a predetermined depth using the photoresist patterns as a mask. A second anodization is carried out to form the $Al_2O_3$ layer up to the surface of the substrate between the electrode wirings, using the photoresist patterns as a mask, whereby the new anodized $Al_2O_3$ layer is used as an insulating layer of the electrode wirings.

6 Claims, 4 Drawing Sheets

METHOD OF FABRICATING THIN FILM TRANSISTOR

CROSS REFERENCE TO RELATED APPLICATION

This is a continuation of U.S. patent application Ser. No. 07/811,799 filed Dec. 20, 1991, now abandoned.

BACKGROUND OF THE INVENTION (1) Field of the Invention

The present invention relates to a method of fabricating a thin film transistor, and more particularly to a method of fabricating a thin film transistor to improve step coverage of electrode wirings and prevent short circuit between a gate electrode and source/drain electrodes.

(2) Description of the Prior Art

Generally, a thin film transistor is used as a switching element for a device such as a flat display device, since it realizes low voltage drive, low power consumption, light weight and high quality imaging. Such a thin film transistor will be briefly described with reference to FIG. 1.

FIG. 1 is a cross section of the construction of a thin film transistor of the prior art. A gate electrode 12 is formed on a glass substrate 10, and insulating layers 13 and 14, semiconductor layer 15 and ohmic layer 16 are successively deposited thereon. Source/drain electrodes 17 and 18 come into contact with the semiconductor layer 15 through the respective ohmic layer 16, and at the same time, the gate insulating layer 14 is contacted underneath the semiconductor layer 15. A transparent conductive film, pixel electrode 19, in contact with the drain electrode 18 is formed on the gate insulating layer 14.

In the manufacturing process of a thin film transistor, step coverage of a thin film made by carrying out general vapor deposition or sputtering is one of critical problems in integrated circuit technology. A geometrical configuration of steps has an effect on each distribution of atom flux that is coated and results in a shadowing phenomenon when a thickness of a thin film deposited on a substrate is changed in thickness or electrically broken, and uneven. This shadowing phenomenon is a factor in deteriorating manufacturing yield, operation and reliability of elements. Besides, due to pinholes, when a manufactured thin film transistor is used as a switching element, a short-circuit occurs between each electrode, in a conventional gate insulating layer.

Japanese Laid Open Gazette No. 90-85826 disclosed a method concerning the formation of gate oxide film by anodization in manufacturing a thin film transistor such that a fine film is formed thereby preventing hillock formation and current leakage. A hillock is a kind of hill usually about 2 μm, grown on the Al surface deposited on a Si substrate usually about 1 μm. This method, however, relates only to forming an oxide film by anodization, and is not capable of improving step coverage of thin gate insulating film, and therefore problems caused thereby are still left unsolved.

As indicated above, hillocks on current leakage are avoided by the present invention. Hillock is a kind of a hill with a height of about 2 μm grown on the Al surface deposited on the Si substrate of a thickness of about 1 μm.

After forming a thin Al layer, hillocks can be observed. One reason hillocks grow is that the coefficient of linear expansion of silicon substrate is 3.3 ppm/° C. and that of a thin Al layer is 23.6 ppm/° C. The difference between the coefficients of these layers causes hillocks of Al to form on the Si substrate.

Hillocks may be divided into edge hillocks, flat topped hillocks and splice-like hillocks as illustrated in FIGS. 4(a), 4(b), and 4(c).

SUMMARY OF THE INVENTION

An object of the present invention is to provide a method of fabricating a thin film transistor to improve step coverage of electrode wirings and prevent short circuit between a gate electrode and source/drain electrodes by preventing hillock formation and current leakage.

In order to obtain the above object, a method of fabricating thin film transistor comprises the steps of:

depositing an aluminum alloy layer, which will become electrode wirings on a substrate;

forming an $Al_2O_3$ layer having a given thickness by a first anodization of the formed aluminum alloy layer;

forming photoresist patterns that correspond to the electrode wirings on the $Al_2O_3$ layer so as to pattern the aluminum alloy layer;

dry-etching the layers composed of the $Al_2O_3$ layer and aluminum alloy layer to an intended depth, using the photoresist patterns as a mask; and carrying out a second anodization to form an $Al_2O_3$ layer up to the surface of the substrate between the electrode wirings, using the photoresist patterns as a mask.

BRIEF DESCRIPTION OF THE DRAWINGS

The above and further objects, features and advantages of the present invention will become more apparent from the following detailed description of embodiments taken in conjunction with the accompanying drawings, wherein.

DETAILED DESCRIPTION OF THE PREFERRED EMBODIMENTS

Figure 1:
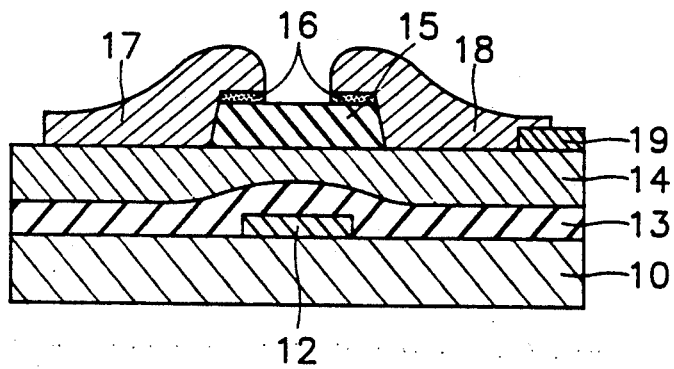
FIG. 1 is a sectional view of a conventional thin film transistor.

Referring now to the drawings, a preferred embodiment of the present invention will be described hereinafter.

FIGS. 2A to 2H are cross-sectional views for illustrating manufacturing steps of a gate wiring and an oxide film of a thin film transistor according to a preferred embodiment of the present invention.

Figure 2A:
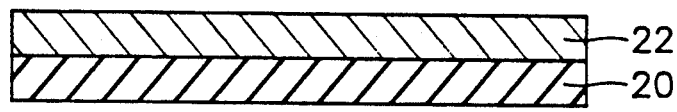
FIGS. 2A to 2H are cross-sectional views describing the manufacturing steps of a gate wiring and a gate oxide film of a thin film transistor according to a preferred embodiment of the present invention.

As shown in FIG. 2A, aluminum alloy 22, a metal of low resistance, is deposited to a thickness of 3000 angstrom on a glass substrate 20. The aluminum alloy is chosen from among Al-Si, Al-Pd, Al-Ni, Al-Ge, or Al-W. Next, referring to FIG. 2B, anodization is carried out, voltage and current being properly controlled in an aqueous solution having weight percentage of 0.01 to 0.5 using any one of an ammonium tartrate, a tartaric acid, or a citric acid. In order to further improve the characteristic of the anodized film of aluminum alloy, it is preferable that a current density is employed between 0.5 to 5 mA/cm$^2$, and a voltage of less than 200 V is used. Although aluminum alloy layer 22 is used as an anode in the preferred embodiment, other materials such as stainless steel or a platinum electrode 25 may be used as a cathode.

Figure 5A:
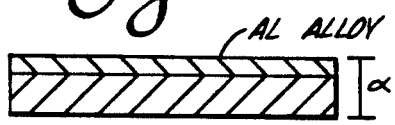
FIGS. 5(a) and 5(b) illustrate the thickness of the $Al_2O_3$ layer at the time of anodization of the aluminum alloy layer before and after complete oxidation.
Figure 5B:
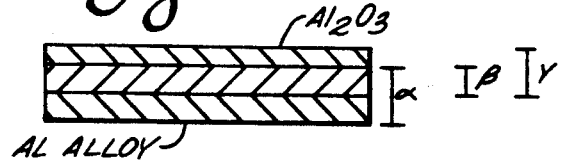

At the time of the anodization of the aluminum alloy layer, it is oxidized by 10 to 11 angstrom in thickness of original Al alloy per volt FIG. 5(a) and when Al alloy is oxidized, its volume is increased. Thus, Al$_2$O$_3$ of 13 to 14 angstrom in thickness (Al alloy oxidized) is generated per volt FIG. 5(b).

Figure 2B:
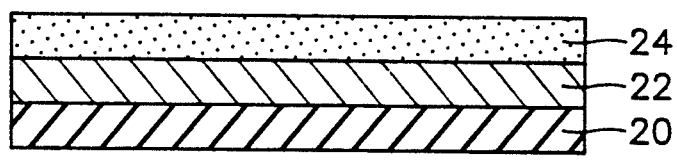

Therefore, when 80 V of voltage is applied at the Al alloy layer of a thickness of 3000 angstrom ($\alpha$), Al alloy is oxidized to about 800 angstrom ($\beta$) ($\approx$80 V$\times$10 angstrom/V) in thickness, and the rest of the Al alloy (2200 angstrom) remains unoxidized. An Al$_2$O$_3$ layer 1000 angstrom ($\gamma$) is generated, ($\approx$80 V$\times$13 angstrom/V) (FIG. 2B).

Figure 2C:
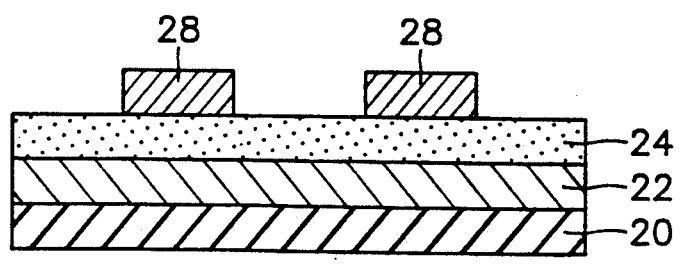

As shown in FIG. 2C. photoresist patterns 28 that corresponds to electrode wirings are formed on the Al$_2$O$_3$ layer 24 so as to pattern the aluminum alloy layer 22.

Figure 2D:
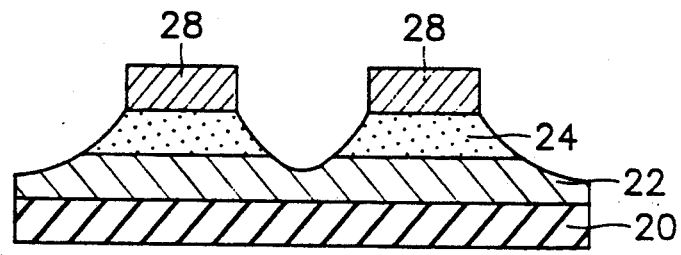
Figure 2E:
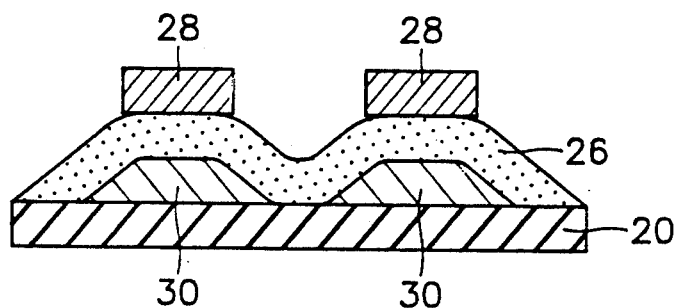
Figure 2F:
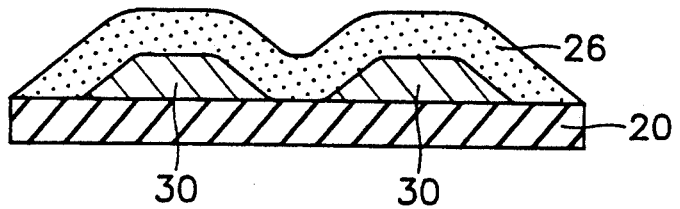

Subsequently, referring to FIG. 2D, parts of the Al$_2$O$_3$ layer 24 and aluminum alloy layer 22 where the photoresist patterns 28 are not formed are dry-etched by the use of one of BCl$_3$, SiCl$_4$, CCl$_4$ and PCl$_3$. In this dry etching, an etching rate is proportioned to etching time, which can be properly controlled. In such a manner, the Al$_2$O$_3$ layer 24 and aluminum alloy layer 22 are etched approximately 1600 angstrom, the whole surface of the aluminum alloy layer is then anodized once again. The anodization process is the same as above. In FIG. 2D, as a voltage of more than 160 V is applied to the aluminum alloy layer 22 having the thickness of 1600 angstrom, a part of the aluminum alloy layer 22 where the photoresist patterns 28 are not formed comes to be anodized such that electrode wirings 30 made of the tapered aluminum alloy are formed and a new Al$_2$O$_3$ layer 26 is formed of uniform thickness thereon, as shown in FIG. 2E. After that, the photoresist patterns are removed (FIG. 2F).

According to the present invention, the aluminum alloy, an electrode wiring material of the low resistance, is anodized thereby forming the electrode wiring insulating film. Thus, conductivity of the electrode wiring becomes high and adhesiveness between the aluminum alloy layer and its anodized film, the Al$_2$O$_3$ layer is excellent. In addition, hillock does not occur even during high temperature process of about 350° C., and short circuit of the metal wirings due to pin holes can be prevented whereby the reliability of thin film transistors can advantageously be improved.

Figure 2G:
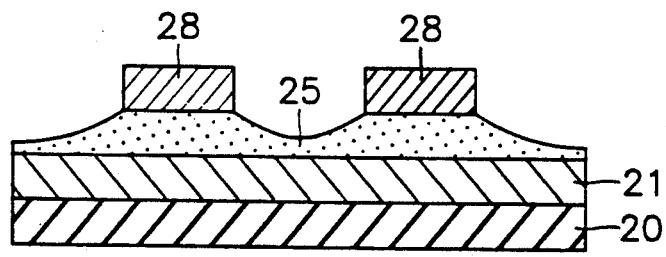

According to another aspect of the invention, when dry-etching Al$_2$O$_3$ layer and Al alloy layer, either only Al$_2$O$_3$ layer may be etched to a predetermined depth as shown in FIG. 2G, or both Al$_2$O$_3$ layer and Al alloy layer may be etched to a predetermined depth as shown in FIG. 2D.

Figure 2H:
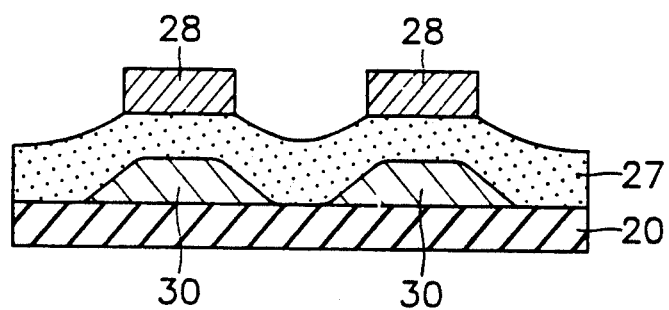
Figure 3:
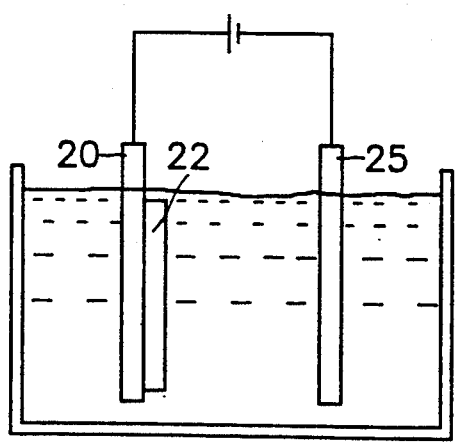
FIG. 3 illustrates a schematic view of the anodization process according to the preferred embodiment of the present invention.
Figure 4A:
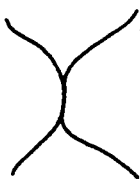
FIGS. 4(a), 4(b), and 4(c) are top views of the different types of hillocks.
Figure 4B:
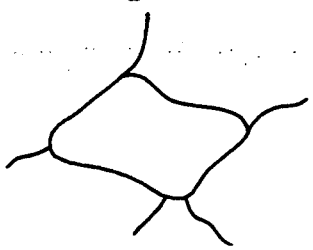
Figure 4C:
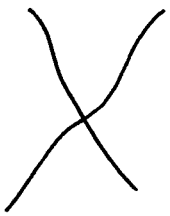

Next, the resultant structure is anodized in the same method as FIG. 2D. As a result, electrode wirings 30 made of the tapered alloy area formed and a flat Al$_2$O$_3$ layer 27 is formed thereon, as shown in FIG. 2H. After that, photoresist patterns are removed (FIG. 2F).

By controlling the etching rate of the Al$_2$O$_3$ layer and aluminum alloy layer at the time of dry-etching, the aluminum alloy can be formed to be tapered in the next anodization step. Therefore, better step coverage is achieved. Formation of hillocks and current leakage is avoided thereby improving yield and reliability.

What is claimed is:

1. A method of fabricating a thin film transistor comprising the steps of:
   depositing an aluminum alloy layer on a substrate;
   forming an Al$_2$O$_3$ layer having a given thickness by anodic oxidation of said aluminum alloy layer;
   forming photoresist patterns on said Al$_2$O$_3$ layer that correspond to electrode wirings to be formed on the aluminum alloy layer;
   dry-etching said Al$_2$O$_3$ layer and aluminum alloy layer to a predetermined depth using said photoresist patterns as a mask; and
   anodically oxidizing said aluminum alloy layer to form a new Al$_2$O$_3$ layer up to the surface of the substrate between the portions of the aluminum layer left to form electrode wirings, using said photoresist patterns as a mask, whereby said new Al$_2$O$_3$ layer is used as an insulating layer of the electrode wirings.

2. A method as recited in claim 1, wherein the aluminum alloy is selected from the group consisting of Al-Si, Al-Pd, Al-Ni, Al-Ge or Al-W.

3. A method as recited in claim 1, wherein the anodization of the aluminum alloy layer is carried out using the aluminum alloy as an anode, and a stainless steel or a platinum electrode as a cathode.

4. A method as recited in claim 3, wherein the current density at anodization is between 0.5 to 5 mA/cm$^2$.

5. A method a recited in claim 3, wherein the anodization is carried out with controlled voltage and current in an aqueous solution having 0.01 to 0.5 wt.% of an ammonium tartrate, a tartaric acid, or a citric acid.

6. A method as recited in claim 1, wherein said Al$_2$O$_3$ layer and aluminum alloy layer are dry-etched by using one from the group consisting of BCl$_3$, SiCl$_4$, CCl$_4$ or PCl$_3$.

* * * * *